United States Patent
Ben-Ezra et al.

(10) Patent No.: US 11,604,907 B2
(45) Date of Patent: Mar. 14, 2023

(54) SYSTEM AND METHOD FOR DESIGNING CAR SYSTEMS

(71) Applicant: OSR ENTERPRISES AG, Cham (CH)

(72) Inventors: Yosef Ben-Ezra, Petah Tikva (IL); Samuel Hazak, Holon (IL); Yaniv Ben-Haim, Kfar Mordechai (IL); Yoni Schiff, Yahud (IL); Shai Nissim, Tel Aviv (IL); Orit Shifman, Petach Tikva (IL)

(73) Assignee: OSR ENTERPRISES AG, Cham (CH)

( * ) Notice: Subject to any disclaimer, the term of this patent is extended or adjusted under 35 U.S.C. 154(b) by 192 days.

(21) Appl. No.: 16/766,680

(22) PCT Filed: Aug. 28, 2017

(86) PCT No.: PCT/IL2017/050959
§ 371 (c)(1),
(2) Date: May 23, 2020

(87) PCT Pub. No.: WO2019/043676
PCT Pub. Date: Mar. 7, 2019

(65) Prior Publication Data
US 2020/0387645 A1    Dec. 10, 2020

(51) Int. Cl.
*G06F 30/15* (2020.01)
*G06F 3/048* (2013.01)
(Continued)

(52) U.S. Cl.
CPC .............. *G06F 30/15* (2020.01); *G06F 3/048* (2013.01); *G06F 9/44* (2013.01); *G06F 9/50* (2013.01);
(Continued)

(58) Field of Classification Search
None
See application file for complete search history.

(56) References Cited

U.S. PATENT DOCUMENTS

| 7,039,511 B1 | 5/2006 | Kreuz |
| 8,639,481 B2 | 1/2014 | Dotan |

(Continued)

OTHER PUBLICATIONS

Geoffrey Biggs, "Flexible, Adaptable Utility Components for Component-Based Robot Software," 2010, 2010 International Conference on Robotics and Automation, 4615-4620 (Year: 2010).*
(Continued)

*Primary Examiner* — Michael J Cobb
(74) *Attorney, Agent, or Firm* — Pearl Cohen Zedek Latzer Baratz LLP

(57) ABSTRACT

A method designing computerized systems for a vehicle by a computing device comprising a processor and a memory device, and corresponding apparatus and computer program product, the method comprising: receiving indications to computerized components to be installed in a vehicle; displaying over a display device a three dimensional manipulatable model of the vehicle; receiving indications to locations within the car where the computerized components are to be installed, the indications provided as locations over the illustration; receiving indications to applications to be executed by a car computer, wherein the applications receive input from at least one of the computerized components; automatically determining the required computing resources and required utility components for supporting the computerized components and provisioning the applications; providing specific alternatives conforming with the computerized components; and receiving selections of specific computerized components from the specific alternatives.

7 Claims, 3 Drawing Sheets

(51) Int. Cl.
*G06F 9/44* (2018.01)
*G06F 9/50* (2006.01)
*G06T 19/00* (2011.01)
*B60R 16/03* (2006.01)

(52) U.S. Cl.
CPC ........ *G06T 19/006* (2013.01); *B60R 16/0315* (2013.01)

(56) References Cited

U.S. PATENT DOCUMENTS

| | | | | |
|---|---|---|---|---|
| 2003/0083947 A1* | 5/2003 | Hoffman | ................ | G06Q 10/06 705/22 |
| 2005/0080502 A1* | 4/2005 | Chernyak | ............... | G06F 30/00 700/97 |
| 2006/0048016 A1* | 3/2006 | Reindler | ................ | G06Q 10/06 714/47.1 |
| 2006/0184345 A1* | 8/2006 | Belschner | ............... | G06F 30/15 703/8 |
| 2007/0226091 A1* | 9/2007 | Daoud | ................... | G06Q 40/12 705/30 |
| 2009/0248463 A1* | 10/2009 | Piochon | ................ | G06Q 10/06 705/7.11 |
| 2010/0030546 A1 | 2/2010 | Dong | | |
| 2010/0031212 A1* | 2/2010 | Dong | ..................... | G06F 30/00 716/100 |
| 2012/0109589 A1 | 5/2012 | Thompson | | |
| 2013/0158955 A1* | 6/2013 | Song | ...................... | G06F 30/23 703/1 |
| 2017/0103160 A1* | 4/2017 | Hynes | .................... | G09B 9/058 |
| 2017/0352198 A1* | 12/2017 | Hasegawa | ............. | G07C 5/008 |
| 2019/0030751 A1* | 1/2019 | Czinger | ............... | B23K 26/342 |
| 2020/0387646 A1* | 12/2020 | Arancibia | ............... | G06T 19/00 |
| 2021/0064795 A1* | 3/2021 | Arancibia | ............... | G06F 30/00 |
| 2021/0247762 A1* | 8/2021 | Park | ............... | G06K 9/6288 |
| 2021/0406147 A1* | 12/2021 | Li | ....................... | G06F 11/3409 |

OTHER PUBLICATIONS

Manoj Debnath, "Understanding the C++ Utility Components in the C++ Standard Library," 2016, CodeGuru, Retrieved from "https://www.codeguru.com/cplusplus/understanding-the-c-utility-components-in-the-c-standard-library/" (Year: 2016).*

ISR and IPRP for PCT/IL2017/050959.

* cited by examiner

SYSTEM AND METHOD FOR DESIGNING CAR SYSTEMS

TECHNICAL FIELD

The present disclosure relates to designing computerized systems in vehicles.

BACKGROUND

Following or in parallel to planning a vehicle internal and external shape and components, an additional layer to be designed comprises the computerized systems within the vehicle, their implementation and interactions. The systems may be related to aspects directly associated with the mere operation of the vehicle, such as engine control, brakes control, or the like. Further aspects may relate to added safety systems such as distance and lane control, to security systems such as capturing the inside or outside of the car, to entertainment systems, or the like.

Each system in itself may be rather complex, and their common, contradicting or competing requirements further increase the complexity level.

BRIEF SUMMARY

One exemplary embodiment of the disclosed subject matter is a computer-implemented method of designing computerized systems for a vehicle by a computing device comprising a processor and a memory device, the method comprising: receiving indications to computerized components to be installed in a vehicle; displaying over a display device a three dimensional manipulatable model of the vehicle; receiving indications to locations within the car where the computerized components are to be installed, the indications provided as locations over the illustration; receiving indications to applications to be executed by a car computer, wherein the applications receive input from at least one of the computerized components; automatically determining the required computing resources and required utility components for supporting the computerized components and provisioning the applications; providing specific alternatives conforming with the computerized components; and receiving selections of specific computerized components from the specific alternatives. Within the method, the indications to the locations are optionally received in a graphic manner over a three dimensional illustration of the vehicle. The method can further comprise receiving priorities between the applications. The method can further comprise providing indications that one or more priorities are unsafe. The method can further comprise: receiving budget constraints; and providing the required computing resources and the specific alternatives in accordance with the budget constraints. The method can further comprise: sending an electronic request to an entity providing a selected component from the selections of specific computerized components including required quantity; and receiving delivery terms and payment terms from the entity. Within the method, determining the required computing resources and required utility components optionally provides for saving computing resources relatively to separate design processes. The method can further comprise determining development time of the computerized systems.

Another exemplary embodiment of the disclosed subject matter is a system for designing computerized systems for a vehicle by a computing device comprising a processor and a memory device, the processor configured to: receive indications to computerized components to be installed in a vehicle; displaying over a display device a three dimensional manipulatable model of the vehicle; receiving indications to locations within the car where the computerized components are to be installed, the indications provided as locations over the illustration; receiving indications to applications to be executed by a car computer, wherein the applications receive input from at least one of the computerized components; automatically determining by required computing resources and required utility components for supporting the computerized components and provisioning the applications; providing specific alternatives conforming with the computerized components; and receiving selections of specific computerized components from the specific alternatives. Within the system, the indications to the locations are optionally received in a graphic manner over a three dimensional illustration of the vehicle. Within the system, the processor is optionally further configured to receive priorities between the applications. Within the system, the processor is optionally further configured to provide indications that one or more priorities are unsafe. Within the system, the processor is optionally further configured to: receive budget constraints; and provide the required computing resources and the specific alternatives in accordance with the budget constraints. Within the system, the processor is optionally further configured to: send an electronic request to an entity providing a selected component from the selections of specific computerized components including required quantity; and receive delivery terms and payment terms from the entity. Within the system, determining the required computing resources and required utility components provides for saving computing resources between applications relatively to separate design processes. Within the system, the processor is optionally further configured to determine development time of the computerized systems.

Yet another exemplary embodiment of the disclosed subject matter is a computer program product comprising a non-transitory computer readable storage medium retaining program instructions configured to cause a processor to perform actions, which program instructions implement: receiving indications to computerized components to be installed in a vehicle; displaying over a display device a three dimensional manipulatable model of the vehicle; receiving indications to locations within the car where the computerized components are to be installed, the indications provided as locations over the illustration; receiving indications to applications to be executed by a car computer, wherein the applications receive input from at least one of the computerized components; automatically determining the required computing resources and required utility components for supporting the computerized components and provisioning the applications; providing specific alternatives conforming with the computerized components; and receiving selections of specific computerized components from the specific alternatives.

BRIEF DESCRIPTION OF THE SEVERAL VIEWS OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings.

DETAILED DESCRIPTION

Figure 1:
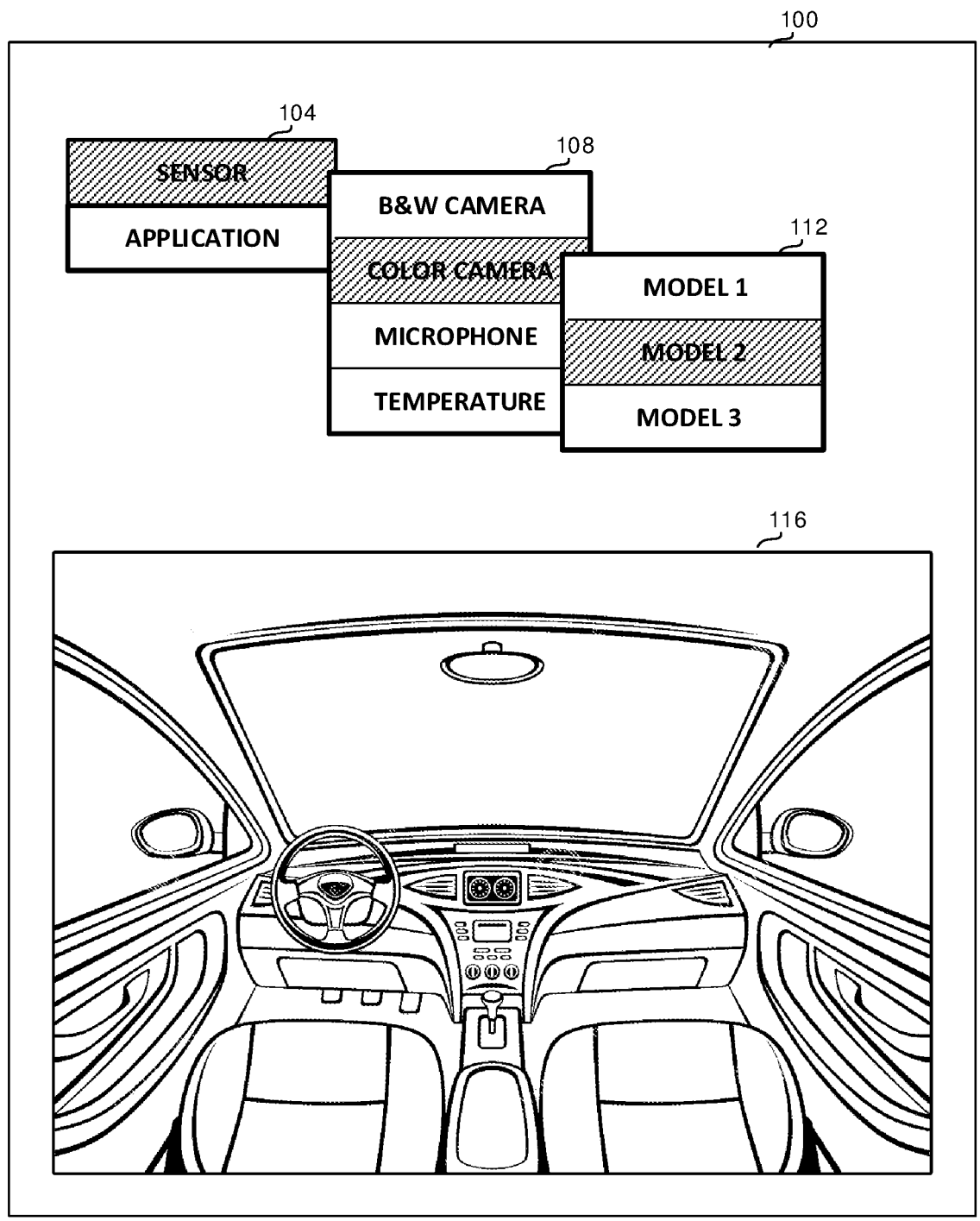
FIG. 1 is an exemplary user interface for providing some of the data, definitions or requirements required for designing the system, in accordance with some embodiments of the disclosure.

In the disclosure below the terms "car" and "vehicle" are used interchangeably, and are intended to cover any type of vehicle, such as automobiles, trucks, trains, or the like.

One technical problem handled by the disclosure relates to the workflow of designing of the computerized systems in a vehicle.

Once the internal and external shape of a vehicle are more or less agreed upon between designers, or even prior to the design being completed, the computerized systems of the car need to be designed.

Designing of the computerized systems may include the type, amount and location of required hardware components such as sensors for example cameras or microphones to be employed, and the type of applications that are planned to be executed within the car.

The computerized systems may include systems which are required for implementing essential functionality, such as autonomous driving systems, engine or brakes control. Further components can include additional safety systems, such as lane control, distance control, or alert providing devices. Yet further systems may include data collection systems, such as systems capturing the roadside, systems capturing the internal of the car and possibly analyzing the images, for example the driver's face or hands, systems that collect reports of the car systems such as the messages transmitted between different car systems and the car computer, the entertainment system, or the like.

In order to design the overall computerized systems, the user needs to provide information about which hardware components are required, for example which cameras (such as but not limited to still, video, color, B&W, IR near IR, multi spectral, hyper spectral, or others), microphones, temperature sensors, pollution sensors, or any other sensors are required. In addition, it is also required to know which applications the user would like to enable, such as autonomous driving, automatic lane control, automatic face or gesture recognition, displaying within the car, storing or transmitting images, video or audio captured by a sensor, automatic climate control, or others.

Once the information is received form one or more users, it is required to determine the other components needed for the systems, such as cables, connectors, controllers or other accessories required for connecting and enabling operation of the various components to the vehicle computer.

It is further required to determine the computing resources needed for enabling the applications, such as processing power, storage volume, connectivity resources such as supported bandwidth, display device resolution, energy consumption, or the like.

Another technical problem handled by the disclosure relates to managing the supply chain of the required equipment, i.e., ensuring that the required quantities are available at the required times, in accordance with the quantities of the cars planned to be manufactured and the relevant timetables, and optionally further in accordance with price limitations.

A technical solution provided by the disclosure relates to a user interface provided to a user, with which the user can select or otherwise indicate sensors or other components to be installed in a car. The user can select the sensor type, minimal performance requirements, or even the exact sensor which may be selected from a list. The user interface can comprise a three dimensional display of the car, which the user can manipulate, and indicate where in or on the vehicle a sensor or another component is to be installed. For example, a camera intended to capture the driver's face can be indicated to be installed against the driver, a microphone for capturing audio within the car can be indicated to be installed between the front sits and the back sits, or the like.

The user can also indicate, using the user interface, the applications to be enabled within the car, such as face and gesture recognition of the driver, voice analysis of the captured audio, lane control, or the like.

The user can further indicate priorities of the applications, or when each application is to be activated. For example, some applications may be activated at all times, other such as road side capturing can be activated only when the car is moving, some applications may have priority over other applications at some of the times, and possibly the other way around at other times, etc.

The system can then determine the equipment required for provisioning the applications, such as cables and connectors required for connecting the sensors or other components to the computer.

The system can further determine the computing resources required for provisioning the applications, such as storage space, bus speed, CPU, GPU, or the like.

In some examples, the system may determine that the required applications cannot be provisioned, due for example to access power consumption required by the computerized systems, which cannot be provided without harming the basic operation of the car or its safety. The system may further determine that providing all applications in accordance with the user provided priorities can be dangerous due to insufficient resources. For example, if the entertainment system is indicated as having higher priority than the lane control, then in some situations the resources may be used for the entertainment rather than to the lane control which can be dangerous.

The user can also indicate total or per-component price limitations, quantities and time table of the cars to be manufactured, for example 100,000 units by January, additional 100,000 units by March and so on.

Once the components and resources are determined, the system can communicate, for example send messages to manufacturers of the components such as the sensors, cables, or the like, with the required quantities and time tables.

The manufacturers can respond with an offer indicating whether they can provide the components, and under which payment and delivery terms.

The user can then be provided with a compiled listing of the required components and their quantities, and one or more supply options for the components, thus constituting a provisioning plan for the system.

Referring now to FIG. 1, showing an exemplary user interface for providing some of the data required for designing the system.

User interface 100 comprises menu 104 for selecting whether the user wishes to add a sensor or an application. In the shown example, the user has selected to add a sensor, and is thus presented with an additional menu 108 for selecting the sensor type, from the list comprising being B&W camera, color camera, microphone or temperature sensor. The user has selected a color camera and is presented with menu 112 indicating existing models for the camera.

The user can then indicate a location for the selected sensor using three dimensional display 116. The user can manipulate the display, for example rotate it around one or more axes, and then point at a location in or out the car at which the sensor is to be placed. If the pointed location cannot be unambiguously determined due to the three dimensionality, two or more possible locations can be displayed to the user to selected from.

If the user has selected an application in menu 104, a corresponding menu listing application types is presented, from which the user can select the application type (such as security, entertainment, documentation, or the like) and then the specific application.

It will be appreciated that user interface 100 is partial and exemplary only, and multiple other options can be implemented for receiving from a user a selection of components and applications.

Figure 2:
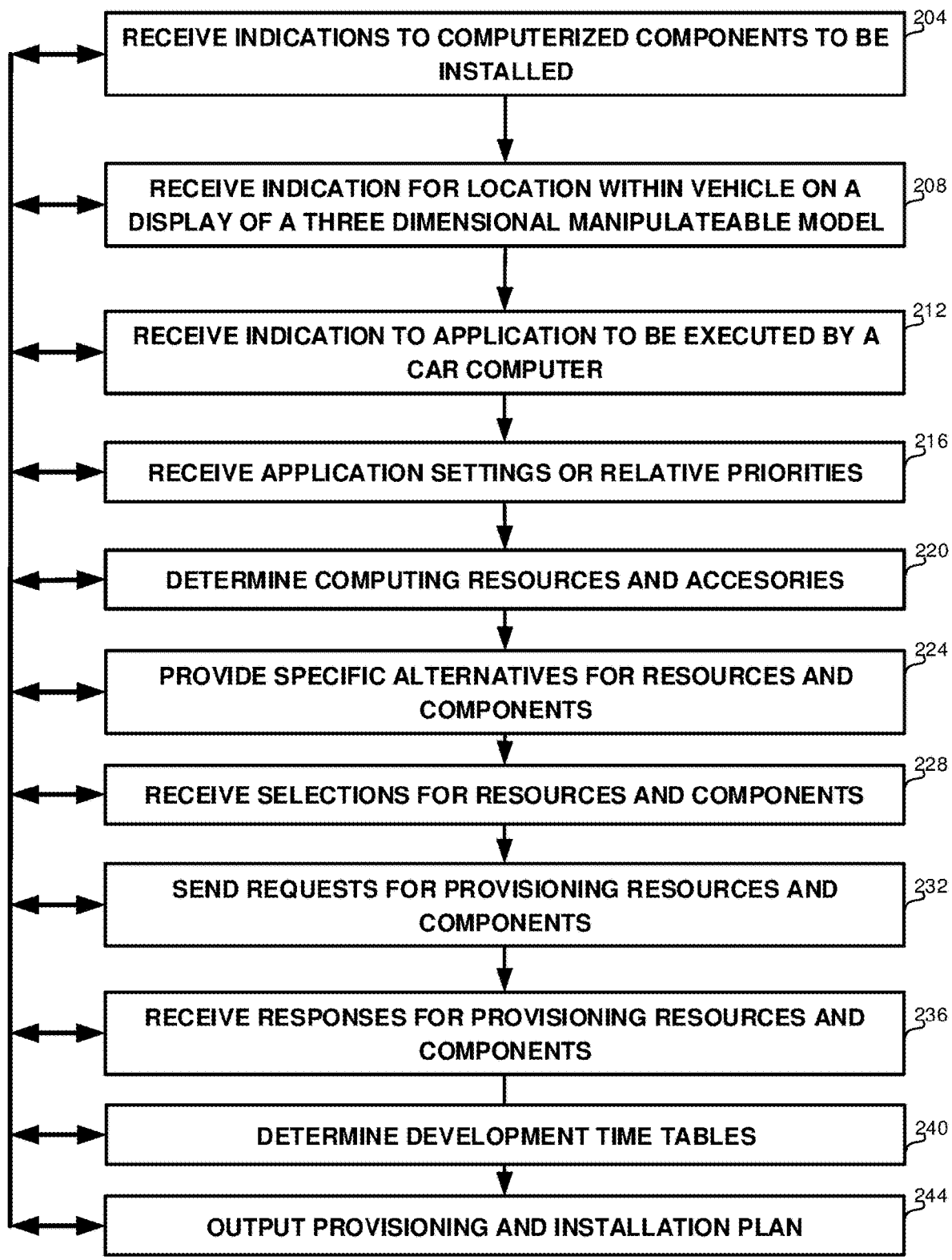
FIG. 2 is an exemplary flowchart of the steps in a method for designing the computerized system of a vehicle, in accordance with some embodiments of the disclosure.

Referring now to FIG. 2, showing an exemplary flowchart of the steps in a method for designing the computerized system of a vehicle.

On step 204, indications to one or more computerized components to be installed within the car is received from a user, the components optionally comprising sensors or computing platforms.

On step 208, an indication is received from the user for a location within the car for the one or more components. The indication can be received using a graphic user interface displaying a three dimensional model of the car, as disclosed in association with FIG. 1 above.

On step 212, an indication to one or more applications to be executed by the vehicle computer can be received from the user, as also disclosed in association with FIG. 1 above, and on step 216 specific settings may be received for the applications, such as when the application is to be activated, relative priorities between applications, indicating which application should be activated and which should be stopped if resources are limited, or the like.

It will be appreciated that 204, 208, 212 and 216 can be performed or repeated at any required order or combination, and are not limited to the presented order.

At step 220, the required computing resources and accessories required for installing the components and activating the applications may be determined. Determination may include, for example, calculating the required cable lengths, required connectors, or other physical accessories. In addition, the required computerized resources are calculated, for example minimal or maximal computing power, storage space, or the like, and also their limitations, such as power consumption, heat dissipation, or the like.

At step 224 alternatives for specific accessories and computing components, such as CPUs or other processing units, storage devices or the like may be displayed to a user and on step 228 selections may be received from the user. In some examples, the user may select more than one option, in order to later compare offers from different providers.

As detailed below, the order of the steps can be changed. Thus, after the resources are determined, further applications may be added which utilize the existing resources and their redundancy, without adding hardware components.

In some examples, the combination of applications and sensors can be infeasible and a corresponding message may be displayed to the user. For example, at specific times such as when the user is driving backwards and it is required to show the expected location of the car, together with analysis of the road side etc. In such cases the user may indicate that one or more applications can be suspended at these times.

At step 232 requests may be sent to manufacturers or providers of the required components, such as the sensors, the accessories, the computing units, or the like. The requests may indicate the required units and the delivery terms, such as the number of units required at each relevant date. It will be appreciated that requests per any one or more components can be sent to one or more providers.

At step 236, responses may be received from the manufacturers or providers, which may include delivery terms and/or payment terms. Negotiations between the parties can follow and the terms may be updated.

At step 240, time tables for the implementation of the computerized systems can be determined. For example, if the computerized systems comprise merely aggregating off the shelf systems, then development time may be short.

However, the implementation of new systems may require research, development, engineering, manufacturing and testing, each having its defined timetable. The data for these stages may be received from a user, retrieved from past development processes, or the like.

At step 244, a complete provisioning and installation plan can be compiled, showing the required components, the provided applications, when the components are to be received, the delivery and payment terms, and when the components are to be installed.

It will be appreciated that he steps above can be performed in any order, for example a user can add sensors or applications after having received responses, go back to defining locations, or the like.

Figure 3:
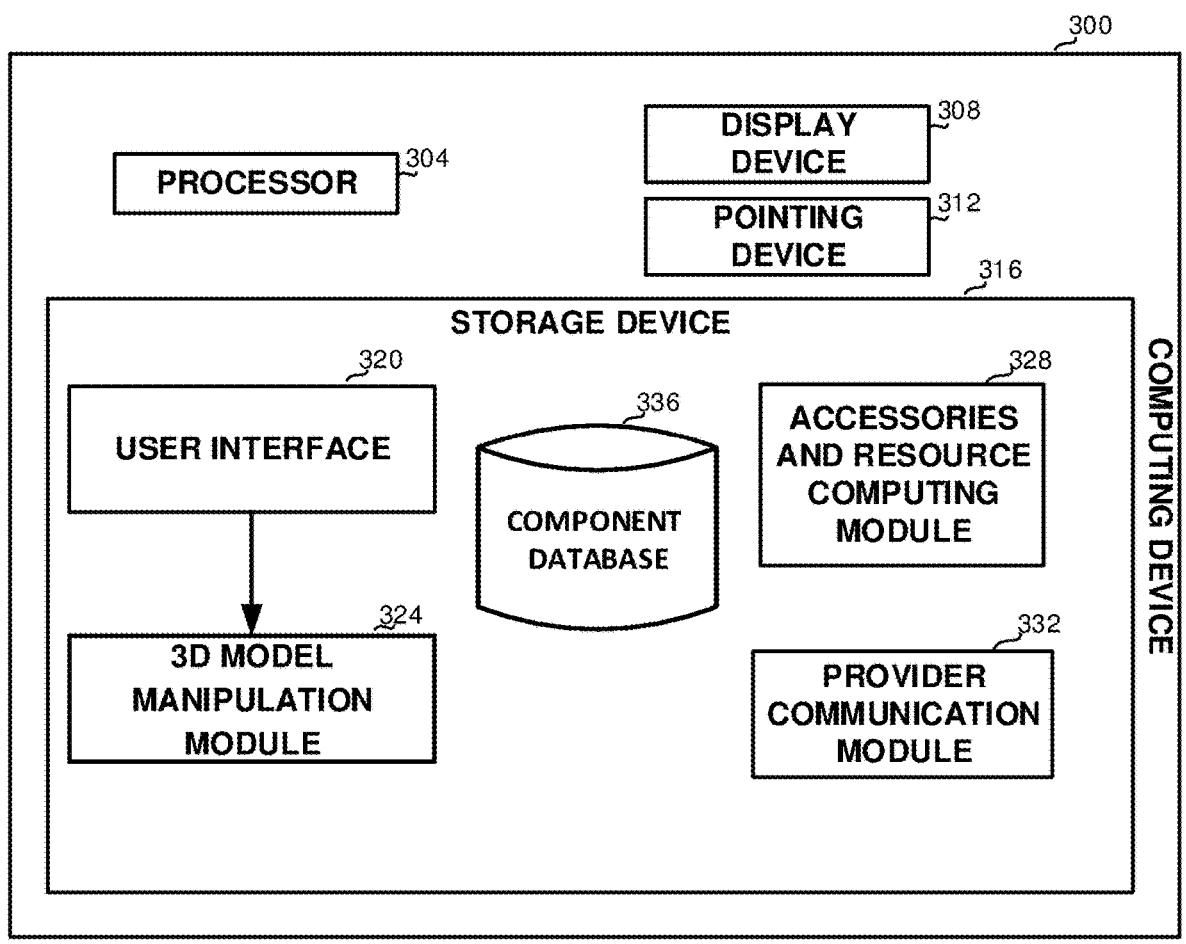
FIG. 3 is a schematic block diagram of an apparatus for designing computerized systems of a vehicle, in accordance with some embodiments of the disclosure.

Referring now to FIG. 3, showing a schematic block diagram of an apparatus for designing computerized systems of a vehicle, in accordance with some embodiments of the disclosure.

The apparatus comprises computing device 300, which may comprise one or more processors 304. Any of processors 304 may be a Central Processing Unit (CPU), a microprocessor, an electronic circuit, an Integrated Circuit (IC) or the like. Alternatively, computing device 300 can be implemented as firmware written for or ported to a specific processor such as digital signal processor (DSP) or microcontrollers, or can be implemented as hardware or configurable hardware such as field programmable gate array (FPGA), application specific integrated circuit (ASIC), GPU, or the like. Processor 304 may be utilized to perform computations required by the apparatus or any of it subcomponents.

Computing device 300 may comprise or be operatively connected to one or more display devices 308 for displaying menus to a user, and also for displaying a three dimensional model of a vehicle.

Computing device 300 may comprise or be operatively connected to one or more pointing devices 312, such as a mouse, a touch screen, or the like. Using pointing devices 312, a user can select options and indicate locations on a model displayed on display device 308. It will be appreciated that computing device 300 may comprise or be operatively connected to additional I/O devices, such as a keyboard, a speaker, a microphone, or the like.

Computing device 300 may comprise one or more storage devices 316 for storing executable components. Storage devices 316 may also contain data during execution of one or more components.

The components detailed below may be implemented as one or more sets of interrelated computer instructions, executed for example by any of processors 304 or by another processor. The components may be arranged as one or more executable files, dynamic libraries, static libraries, methods, functions, services, or the like, programmed in any programming language and under any computing environment.

In some exemplary embodiments of the disclosed subject matter, storage device 316 may comprise user interface 320 for displaying information to a user, for example over display device 308, and receiving user responses via pointing device 312, a keyboard, or the like. User interface 320 may comprise or be operatively coupled to 3D model manipulation module 324 which may display a model, rotate the model upon user instructions, resize the model, identify locations within the model from user indications, possibly including resolving ambiguity by showing to a user a number of possible interpretations to an indicated location and receiving the user's selection, etc.

User interface 320 can also display a report of the selected components, their locations, delivery terms, payment terms, or the like.

Storage device 316 may comprise accessories and resource computing model 328 for receiving the components or sensors selected by the user, their locations and applications to be provided, and computing the required accessories for connecting the components or sensors, and for providing the computing resources required for the applications.

Storage device 316 may comprise provider communication module 332 for sending requests to component providers, including delivery terms and receiving responses, including suggested delivery terms. Payment terms, etc.

Some of the modules above, for example user interface 320 may communicate with component database 336 comprising data about components such as sensors, processing units, accessories, or the like, optionally including but not limited to their types, requirements, features, physical properties, or the like. Additionally or alternatively, storage device 316 can comprise a communications unit for communicating with an external component database, such as a server component database.

The present invention may be a system, a method, and/or a computer program product. The computer program product may include a computer readable storage medium (or media) having computer readable program instructions thereon for causing a processor to carry out aspects of the present invention.

Storage device 316 may be persistent or volatile. Storage device 316 may retain data structures and program code operative to cause processors 304 to perform acts associated with any of the steps shown in FIG. 2 above. Storage device 316 can be a tangible device that can retain and store instructions for use by an instruction execution device, storage device 316 may be, for example, but is not limited to, an electronic storage device, a magnetic storage device, an optical storage device, an electromagnetic storage device, a semiconductor storage device, a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, or any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). Each block may be implemented as a multiplicity of components, while a number of blocks may be implemented as one component. Even further, some components may be located externally to the car, for example some processing may be performed by a remote server being in computer communication with a processing unit within the vehicle. In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of designing computerized systems for a vehicle by a computing device comprising a processor and a memory device, the method comprising:
   receiving a selection of computerized components to be installed in the vehicle;
   displaying on a display device a three dimensional manipulatable model of the vehicle;
   receiving a selection of locations within the vehicle where the computerized components are to be installed, the selection of locations is provided as locations over the three dimensional manipulatable model;
   receiving a selection of applications to be executed by a vehicle computer, wherein the applications receive input from at least one of the computerized components;
   automatically determining required computing resources and required utility components for supporting the computerized components and provisioning the applications, wherein the required computing resources comprise at least one of computing power and storage space, and wherein the required utility components comprise at least a cable length;
   receiving a priority order of the selected applications, wherein the applications to be executed are executed based on the received priority order and the determined computing resources;
   providing indications to one or more user that the one or more user selected priorities are causing resources to be allocated in an unsafe manner and that there are insufficient resources to provide the applications according to the one or more user selected priorities;
   providing alternative components conforming with the selected computerized components; and
   receiving selections of specific computerized components from the alternative components.

2. The method of claim 1, wherein the selection of the locations are received in a graphic manner over the three dimensional manipulatable model of the vehicle.

3. The method of claim 1, further comprising determining development time of the computerized systems based on availability of the selected computerized components.

4. A system for designing computerized systems for a vehicle by a computing device comprising a processor and a memory device, the processor configured to:
   receive a selection of computerized components to be installed in the vehicle;
   display on a display device a three dimensional manipulatable model of the vehicle;
   receive a selection of locations within the vehicle where the computerized components are to be installed, the selection of locations is provided as locations over the three dimensional manipulatable model;
   receive a selection of applications to be executed by a vehicle computer, wherein the applications receive input from at least one of the computerized components;
   automatically determine by required computing resources and required utility components for supporting the computerized components and provisioning the applications, wherein the required computing resources comprise at least one of computing power and storage space, and wherein the required utility components comprise at least a cable length;

receive a priority order of the selected applications, wherein the applications to be executed are executed based on the received priority order and the determined computing resources;

provide indications to one or more user that the one or more user selected priorities are causing resources to be allocated in an unsafe manner and that there are insufficient resources to provide the applications according to the one or more user selected priorities;

provide alternative components conforming with the computerized components; and receive selections of specific computerized components from the alternative components.

5. The system of claim 4, wherein the selection of the locations are received in a graphic manner over the three dimensional manipulatable model of the vehicle.

6. The system of claim 4, wherein the processor is further configured to determine development time of the computerized systems based on availability of the selected computerized components.

7. A computer program product comprising a non-transitory computer readable storage medium retaining program instructions configured to cause a processor to perform actions, which program instructions implement:

receiving a selection of computerized components to be installed in the vehicle;

displaying on a display device a three dimensional manipulatable model of the vehicle;

receiving a selection of locations within the vehicle where the computerized components are to be installed, the selection of locations is provided as locations over the three dimensional manipulatable model;

receiving a selection of applications to be executed by a vehicle computer, wherein the applications receive input from at least one of the computerized components;

automatically determining the required computing resources and required utility components for supporting the computerized components and provisioning the applications, wherein the required computing resources comprise at least one of computing power and storage space, and wherein the required utility components comprise at least a cable length;

receiving a priority order of the selected applications, wherein the applications to be executed are executed based on the received priority order and the determined computing resources;

providing indications to one or more user that the one or more user selected priorities are causing resources to be allocated in an unsafe manner and that there are insufficient resources to provide the applications according to the one or more user selected priorities;

providing alternative components conforming with the computerized components; and receiving selections of specific computerized components from the alternative components.

* * * * *